(12) United States Patent
Bohn, Jr. et al.

(10) Patent No.: US 7,117,807 B2
(45) Date of Patent: Oct. 10, 2006

(54) DYNAMICALLY MODIFIABLE POLYMER COATINGS AND DEVICES

(75) Inventors: Clayton C. Bohn, Jr., Gainesville, FL (US); Anthony B. Brennan, Gainesville, FL (US); Ronald H. Baney, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 132 days.

(21) Appl. No.: 10/780,424

(22) Filed: Feb. 17, 2004

(65) Prior Publication Data

US 2005/0178286 A1 Aug. 18, 2005

(51) Int. Cl.
*B63B 59/04* (2006.01)
*B63B 1/34* (2006.01)

(52) U.S. Cl. ..................... 114/222; 114/67 R
(58) Field of Classification Search .............. 114/67 R, 114/222
See application file for complete search history.

(56) References Cited

U.S. PATENT DOCUMENTS

| | | | | |
|---|---|---|---|---|
| 3,935,485 A | * | 1/1976 | Yoshida et al. | 310/339 |
| 3,971,084 A | * | 7/1976 | Spier | 114/357 |
| 4,283,461 A | * | 8/1981 | Wooden et al. | 428/422 |
| 4,297,394 A | * | 10/1981 | Wooden et al. | 427/100 |
| 5,645,764 A | * | 7/1997 | Angelopoulos et al. | 252/500 |
| 5,976,284 A | * | 11/1999 | Calvert et al. | 156/51 |

* cited by examiner

*Primary Examiner*—Sherman Basinger
(74) *Attorney, Agent, or Firm*—Akerman Senterfitt

(57) ABSTRACT

A dynamic coating includes at least one polymeric layer for attachment to a surface. The polymeric layer includes at least one electrically conducting polymer including layer, wherein under influence of a dynamic signal applied to the polymeric layer, a contact angle of the polymeric layer dynamically and substantially increases or decreases upon oxidation or reduction of the polymer. The polymeric layer can also expand or contract upon oxidation or reduction. The coating can be used for a variety of applications including a non-toxic biofouling preventative system and for forming low voltage electrowetting pumps.

27 Claims, 6 Drawing Sheets

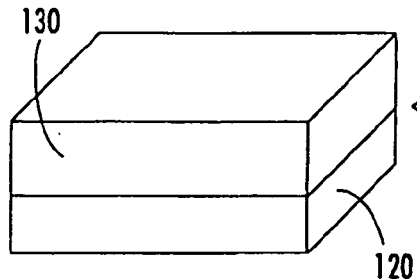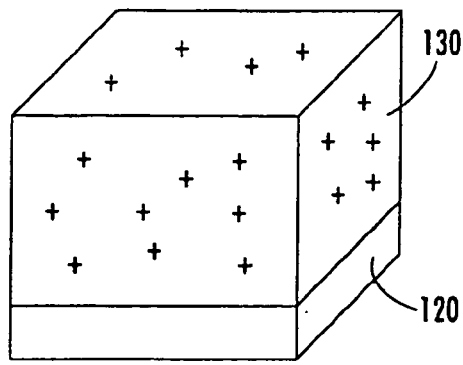
FIG. 1(a)          FIG. 1(b)
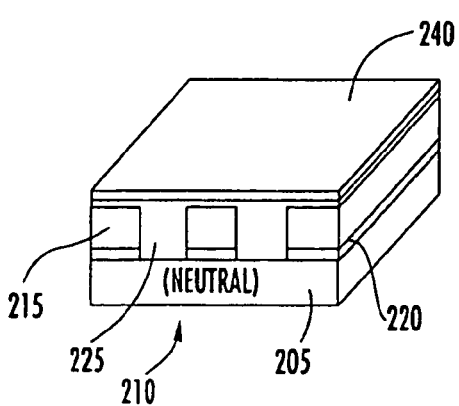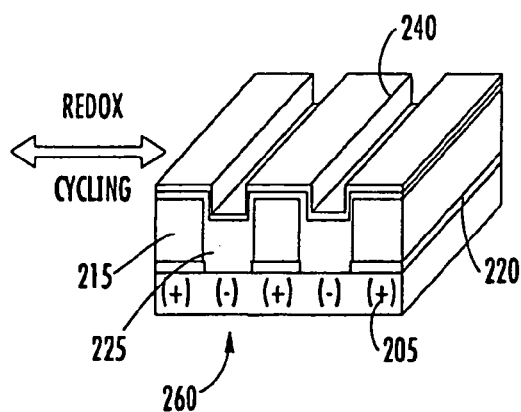
FIG. 2(a)          FIG. 2(b)

|  | DEPTH (um) | SPACING (um) | WIDTH (um) | ROUGHNESS FACTOR |
|---|---|---|---|---|
| RIBLET | 5 | 2 | 2 | 5.0 |
| RIBLET | 8 | 2 | 2 | 7.3 |
| RIBLET | 10 | 2 | 2 | 8.9 |
| STAR/CLOVER | 5 | 2 | 4 | 4.5 |
| STAR/CLOVER | 8 | 2 | 4 | 6.6 |
| STAR/CLOVER | 10 | 2 | 4 | 8.0 |
| STAR/CLOVER | 5 | 2 | 2,4 | 3.6 |
| STAR/CLOVER | 8 | 2 | 2,4 | 5.2 |
| STAR/CLOVER | 10 | 2 | 2,4 | 6.2 |
| GRADIENT | 5 | 1,2,3,4 | 2 | 2.8 |
| GRADIENT | 8 | 1,2,3,4 | 2 | 3.8 |
| GRADIENT | 10 | 1,2,3,4 | 2 | 4.5 |
| TRIANGLE/CIRCLE | 5 | 1 | 1,5 | 7.5 |
| TRIANGLE/CIRCLE | 5 | 2 | 2,10 | 4.2 |
| TRIANGLE/CIRCLE | 5 | 3 | 3,15 | 3.2 |
| TRIANGLE/CIRCLE | 8 | 1 | 1,5 | 11.3 |
| TRIANGLE/CIRCLE | 8 | 2 | 2,10 | 6.2 |
| TRIANGLE/CIRCLE | 8 | 3 | 3,15 | 4.4 |
| TRIANGLE/CIRCLE | 10 | 1 | 1,5 | 13.9 |
| TRIANGLE/CIRCLE | 10 | 2 | 2,10 | 7.5 |
| TRIANGLE/CIRCLE | 10 | 3 | 3,15 | 5.3 |

FIG. 5

DYNAMICALLY MODIFIABLE POLYMER COATINGS AND DEVICES

STATEMENT REGARDING FEDERALLY SPONSORED RESEARCH OR DEVELOPMENT

The Government has certain rights to the invention based on Office of Naval Research Grant No. N00014-02-1-0325.

CROSS-REFERENCE TO RELATED APPLICATIONS

Not applicable.

FIELD OF THE INVENTION

The invention relates to polymer-based coatings having dynamically alterable surfaces and related devices which include at least one electrically conducting polymer.

BACKGROUND

Biofouling is the result of marine organisms settling, attaching, and growing on submerged marine surfaces. The biofouling process is initiated within minutes of a surface being submerged in a marine environment by the absorption of dissolved organic materials which result in the formation of a conditioning film. Once the conditioning film is deposited, bacteria (e.g. unicellular algae) colonize the surface within hours of submersion. The resulting biofilm produced from the colonization of the bacteria is referred to as microfouling or slime and can reach thicknesses on the order of 500 µm.

Biofouling is estimated to cost the US Navy alone over $1 billion per year by increasing the hydrodynamic drag of naval vessels. This in turn decreases the range, speed, and maneuverability of naval vessels and increases the fuel consumption by up to 30–40%. Thus, biofouling weakens the national defense. Moreover, biofouling is also a major economical burden on commercial shipping, recreational craft, as well as civil structures, bridges, and power generating facilities.

Any substrate in regular contact with water is likely to become fouled. No surface has been found that is completely resistant to fouling. Due to the vast variety of marine organisms that form biofilms, the development of a single surface coating with fixed surface properties for the prevention biofilm formation for all relevant marine organisms is a difficult if not impossible task.

Anti-fouling and foul-release coatings are two main approaches currently used for combating biofilm formation. Anti-fouling coatings prevent or deter the settling of biofouling organisms on a surface by the use of leached biocides, typically cuprous oxide or tributyltin, into the water. The biocides are either tethered to the coated surface or are released from the surface into the surrounding environment. Use of these types of coatings has caused damage to the marine ecosystem, especially in shallow bays and harbors, where the biocides can accumulate. As such, the use of tributyltin has been banned in many parts of the world. These products are effective for only approximately 2 to 5 years.

Foul release coatings present a hydrophobic, low surface energy, and resulting slippery surface that minimizes the adhesion of the biofouling organisms. The most commonly used and highly successful of these is a nontoxic silicone-based paint. The silicone-based coating requires several layers to make it effective, and therefore it can be quite costly. Effectiveness lasts up to 5 years at which time recoating may become necessary. These products are considered to be more environmentally sound as compared to anti-fouling coatings because they do not leach toxins. However, they are subject to abrasion, and therefore their use is limited to areas that are not susceptible to damage caused by ice or debris.

SUMMARY OF THE INVENTION

A dynamic polymer-based coating includes at least one polymeric layer for attachment to a surface. The polymeric layer includes at least one electrically conducting polymer, wherein a contact angle of the polymeric layer substantially increases or decreases upon at least one of oxidation and reduction. In a preferred embodiment, the polymer layer substantially expands or contracts in at least one direction upon at least one of oxidation and reduction relative to its uncharged (neutral) state.

The polymeric layer can be a patterned layer which comprises a plurality of microscale or nanoscale features. The plurality of features can provide a roughness factor (R) of at least 2, and in a preferred embodiment a roughness factor of at least 8. The spacing between adjacent features can be microscale or nanoscale, such as less than 2 µm.

The polymeric layer is preferably a polymer composite, the polymer composite including at least one non-electrically conducting polymer mixed with an electrically conducting polymer. The non-electrically conducting polymer can be selected from a variety of polymers, including an elastomer, a rubber, a polyurethane, a polyimide, a polyamide and a polysulfone. The electrically conducting polymer can be polypyrrole, poly(p-phenylene) and polythiophene, and derivatives thereof.

An electrode layer is generally disposed beneath the polymeric layer. The electrode layer can be a patterned layer, the pattern comprising a plurality of microscale or nanoscale features, such as an interdigitated pattern which matches the pattern of the polymeric layer.

A capping layer can be disposed on the patterned polymeric layer. The capping layer can comprises a flexible polymer, the flexible polymer selected from the group consisting of silicones, polyurethanes, and polyimides. A solid polymer electrolyte can be provided between the plurality of features of the patterned polymeric layer.

In another embodiment of the invention, a non-toxic biofouling preventative system includes a polymer-based coating disposed on a subsurface of a boat or ship. The coating comprises a polymeric layer, the polymeric layer including at least one electrically conducting polymer. The polymeric layer generally includes at least one non-electrically conductive polymer mixed with the electrically conducting polymer.

A power supply supplies a dynamic electrical signal to the polymeric layer, wherein a contact angle of the polymeric layer substantially increases or decreases upon at least one of oxidation and reduction responsive to the dynamic signal. The polymer layer can also substantially expand or contract in at least one dimension (e.g. height, or width) upon at least one of oxidation and reduction. The subsurface of the boat or ship can be a metal or metal alloy (e.g. steel), wherein one terminal of the power supply is electrically connected to the subsurface of the boat or ship.

In one embodiment, the polymer layer is a patterned polymer layer, such as pattern of electrically isolated features. In this embodiment, the system can include a patterned electrode layer beneath the polymeric layer, where the electrode pattern is interdigitated and aligned with the features. The patterned polymer can include a plurality of microscale or nanoscale features. The plurality of features preferably provide a roughness factor (R) of at least 2, and more preferably at least 8. The spacing between adjacent features can be microscale or nanoscale, such as less than 2 µm.

In yet another embodiment of the invention, an electrowetting-based fluid pump includes a fluid conduit for flowing an electrolyte comprising fluid, and a plurality of electrodes and a polymeric layer disposed on the plurality of electrodes attached to an inner surface of the conduit. The polymeric layer includes at least one electrically conducting polymer. A power supply applies a dynamic signal between the plurality of electrodes and the fluid or another electrode disposed opposite the plurality of electrodes. As a result, the contact angle of the polymeric layer substantially increases or decreases upon at least one of oxidation and reduction of the polymer layer responsive to the dynamic signal, thus pumping the fluid through the conduit. The pump can be formed using standard microelectronics process, where an integrated circuit substrate (e.g. silicon) is used, where the pump is integrated with the substrate.

BRIEF DESCRIPTION OF THE DRAWINGS

A fuller understanding of the present invention and the features and benefits thereof will be obtained upon review of the following detailed description together with the accompanying drawings, in which:

FIGS. 1(a) and (b) show an electrically conductive polymer composite disposed on an electrode layer in its reduced (neutral) and in its oxidized state, respectively, according to an embodiment of the invention.

FIGS. 2(a) and (b) show a substrate coated with a patterned electrically conducting polymer comprising a plurality of features disposed on a patterned electrode layer in its reduced state and its oxidized state, respectively, according to an embodiment of the invention.

FIG. 5 is a table including exemplary feature depths, feature spacing, feature width and the resulting roughness factors achieved based on the patterns shown in FIGS. 4(a)–(d).

DETAILED DESCRIPTION OF THE INVENTION

Figure 3:
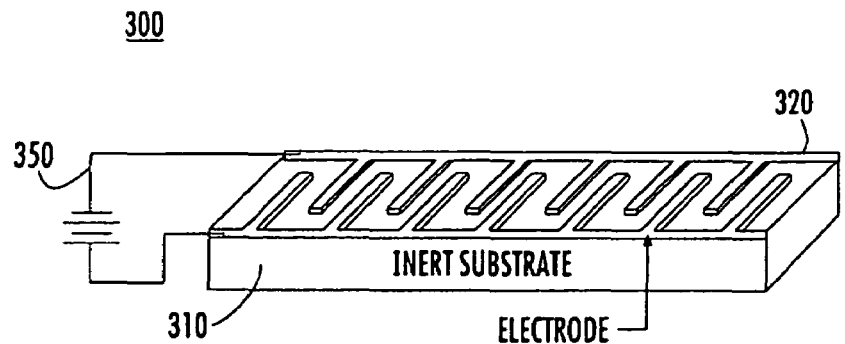
FIG. 3 shows a simplified interdigitated electrode pattern which can be used with the coated substrate shown in FIGS. 2(a) and (b).

A dynamic coating includes at least one a polymeric layer for attachment to a surface. The polymeric layer preferably includes at least one electrically conducting polymer. Although the invention will generally be described using a single patterned polymeric layer which includes an electrically conducting polymer, the coating can be unpatterned, or include two or more layers, where one or more of the patterned polymeric layers are non-electrically conductive polymer layers.

As used herein, the phrase "electrically conducting polymer" refers to a polymer which provides a room temperature electrical conductivity of at least 0.1 S/cm, preferably at least 1 S/cm, such as 10 S/cm, 20 S/cm, 40 S/cm, 100 S/cm, 200 S/cm or 1,000 S/cm. The polymeric layer can be formed from a single electrically conductive polymer, or be a composite material, such as a material formed by blending an electrically conductive polymer with a non-electrically conductive polymer. The non-electrically conductive polymer is generally preferably added to provide elasticity to the composite because electrically conducting polymers are normally mechanically quite brittle. Sufficient electrical conductivity is desirable to limit ohmic heating during dynamic biasing.

In the case of composite polymers, the composite material will have a lower electrical conductivity as compared to the electrically conductive polymer. The electrical conductivity of the polymer composite is at least that of a semiconductor, being at least $1 \times 10^{-6}$. In a preferred embodiment, the composite polymer provides an electrical conductivity of at least $10^{-4}$ S/cm, such as $10^{-3}$ S/cm, $10^{-2}$ S/cm, 0.1 S/cm, and preferably at least 1 S/cm, such as 10 S/cm, 20 S/cm, 40 S/cm, or 100 S/cm.

Although the coating is generally described herein as being an entirely polymeric layer, the coating can include a plurality of electrically conductive metal or ceramic particles, or electrically conducting carbon nanotubes. Mixing a polymer with electrically conductive metal or ceramic particles or nanotubes can permit formation of polymer comprising layers having enhanced electrical conductivity.

Electrically conductive polymers are one class of electroactive polymer. Although not needed to practice the claimed invention, Applicants, not seeking to be bound to theory, present the following mechanism for modulation of surface properties of coatings according to the invention based on oxidation/reduction. Specifically, upon application of an electrical bias to the polymer coating relative to another electrochemically active material sufficient to oxidize or reduce the polymer in the presence of a suitable electrolyte, the polymer layer undergoes oxidation or reduction which results in a change in its surface properties, including surface energy, surface tension, modulus and contact angle.

Because of the relative ease of measurement and quantification, contact angle will be generally used herein to describe the dynamic changes electrochemically induced in the polymeric layer. As used herein, a substantial increase or decrease in contact angle refers to a change in contact angle between the charged and uncharged states of the polymer of at least 8 degrees, preferably at least 12 degrees, and more preferably at least 16 degrees. As noted above, the charged state of the polymer can be the reduced state, the oxidized state, or both the reduced and oxidized state relative to their neutral state.

The polymeric layer may also substantially expand or contract upon at least one of oxidation and reduction. As with the contact angle changes, the expansion and/or contraction can follow an applied dynamic electrical signal. In a preferred embodiment, As defined herein, the phrase "substantially expands or contracts" relative to the polymeric layer refers to an expansion or contraction in at least one dimension, such as the height or width, of features comprising the polymeric layer of at least 1%, and preferably at least 5%, and more preferably at least 10%.

Thus, incorporation of electrically conducting polymers (hereafter "conducting polymers") in the polymeric layer allows for the formation of a single dynamic surface coating with variable surface properties, which can include topographical changes. The coating can be used in a variety of applications including non-toxic biofouling preventative system or for forming low voltage electrowetting pumps.

Electrically conductive polymers have recently received significant attention in the past due to their ability to generate various responses under electrical or chemical stimuli along with their electrical conductivity. Most notable for this invention is the ability of conductive polymers to undergo surface energy and generally also dimensional changes during chemical or electrochemical oxidation and reduction, believed to be due to development of charge along the polymer backbone.

Electrically conducting polymers are generally characterized as having a fully conjugated polymer backbone with an extended π-bonding system. However, some block copolymers which comprise conducting (conjugated) and non-conducting (non-conjugated) segments can provide conductivities sufficient to be classified as conductive polymers as defined herein. Conjugation allows for electron and charge delocalization along the polymer backbone. The dimensional change associated with oxidation (and/or reduction) of conducting polymers in electrolyte solutions, such as salt solutions and body fluids, is mainly induced by the influx of solvent and counter ions into the conducting polymer matrix to balance the developed increasing charge resulting in a dimensional change of the material. During the reverse process, the material generally returns to its neutral (uncharged) state and the counter ions are expelled from the polymer matrix resulting in a dimensional change. Some materials swell in their oxidized state such as polypyrrole (PPy), while poly(p-phenylene) (PPP) is swollen in its reduced state. Some materials can swell in both oxidized and reduced states relative to their neutral state, such as Poly(3-methylthiophene) (PMeT).

Exemplary electrically conducting polymers that can generally be used with the invention include PPy, polythiophene, and PPP, and their derivatives. These polymers can all be stimulated to undergo reversible physical changes in volume, surface energy and related properties, color, and light emission. In the case of PPy, a volume change of about 1–3% longitudinally and about 35% in thickness on a bound surface can be induced by electrochemically switching (redox cycling) the material between its oxidized (swollen) and reduced (contracted) forms. This large volume change induced during redox cycling will generally be accompanied by changes in the surface energy and related properties of the PPy comprising layer. PPy is characterized by high stability in its oxidized form due to its oxidation potential about $-0.2V$ which is close to the $O_2$ reduction potential at about $-0.2$ to $-0.3V$. Therefore, neutral PPy will be oxidized by $O_2$ to form its oxidized conducting form when exposed to air. PPy can be synthesized chemically or electrochemically in various media. The chemical polymerization can be facilitated in the presence of Lewis Acids such as $FeCl_3$ or ammonium persulfate along with codopants such as $NaClO_4$.

Polythiophene is another electrically conductive polymer that can be used with the invention. Polythiophenes provide stability in the oxidized as well as reduced states. They also possess many highly desirable electrical, optical, and redox properties. The thiophene monomer can easily be derivatized using a number of chemistries. It has been shown that by changing the substituants on the thiophene ring the oxidation potential of the resulting monomer and polymer can be varied between 1.20 to 2.00V and 0.70 to 1.45V, respectively. Poly(3-methylthiophene) (PMeT) in particular has an oxidation potential of about 0.8V and reaches a fully reduced state at about 0.2V vs. Ag/AgCl. These values lie well above and below the $O_2$ reduction and $H_2O$ oxidation potentials, respectively, thus allowing for good stability in both forms. PMeT can also be polymerized in a similar fashion as PPy.

Poly(p-phenylene) (PPy) is another exemplary electronically conductive polymer that can be used with the invention. One of the disadvantages of PPy is its high stability in its oxidized (charged) form. This can hinder the return of the PPy-PDMS surface back to its original uncharged state.

Poly(p-phenylene) (PPP) on the other hand exhibits exceptional stability in its neutral form. The oxidation potential of PPP is around +1.2V which is very close to the oxidation potential of water, therefore water can reduce the oxidized form of PPP to its more stable neutral form. PPP is also characterized as being highly crystalline, difficult to process, insoluble, and exhibits high resistance to oxidation, radiation, and thermal degradation. PPP can be synthesized from benzene in the presence of Lewis acid such as $FeCl_3$ (~70° C.) and $AlCl_3$ (~37° C.) along with an additional oxidizing agent.

Other exemplary electrically conducting polymer which may be used with the invention include polyaniline, polyacetylene, polyazulenes, ladder polymers, such as polyacene and its derivatives, polyquinones and its derivatives, and polystyrene sulfonate.

FIGS. 1(a) and (b) show a polymer composite 130 comprising an electrically conducting polymer blended with a non-electrically conductive polymer shown in its reduced (neutral) state and oxidized state, respectively. Polymeric layer 130 is disposed on a continuous electrode layer 120, such as the steel hull of a ship. For example, the polymer composite can include an electrically conductive polymer, such as polythiophene, mixed with a PDMS elastomer (hereafter referred to herein as PDMSe) which imparts flexibility to the polymer composite. However, if an electrically conductive polymer becomes available having sufficiently elastic properties to prevent cracking upon dynamic cycling according to the invention, substantially the entire polymer layer can comprise the electrically conductive polymer.

Although the polymer depicted in FIGS. 1(a) and (b) shows a significant topographical change in its height (thickness) dimension between its reduced (neutral) and oxidized states, composite polymers according to the invention do not need to exhibit a significant change in topography. A substantial change in contact angle and associated changes in surface tension and surface energy is all that is required.

As shown in FIGS. 1(a) and (b), polymeric layer 130 is a continuous layer and is thus electrically interconnected throughout. Upon application of an appropriate potential difference between electrode layer 120 and polymer layer 130 in the presence of an electrolyte (not shown), the entire polymer composite layer 130 becomes positively charged and swells to its oxidized form shown in FIG. 1(b). Although the polymeric layer 130 shown in FIGS. 1(a) and (b) swells upon oxidation by drawing in neighboring anions (not shown), as noted above, other polymers swell upon reduction, and other polymers swell upon both reduction and oxidation as compared to their neutral state. Moreover, as again noted above, other electrically conductive polymers due not exhibit a substantial change in topography upon reduction or oxidation. In the case of the polymer composite shown in FIGS. 1(a) and (b), anions to provide swelling to the oxidized state can be provided by a surrounding electrolyte (not shown), such as an electrolyte gel, or seawater in the case of marine applications.

The composition of the polymer composite will generally vary depending on the properties of the electrically conductive polymer provided. The concentration of the electrically conductive polymer is generally in the range of about 2–10 wt % to over 50 wt % of the overall composite.

For small area polymer layer applications, such as on the order of square millimeters, or less, techniques such as conventional lithography and etching, ink-jet printing can be used to form a desired polymer pattern if a pattern is desired. When larger area layers are required, such as on the order of square centimeters, or more, spray, dipcoat, hand paint or a variant of the well known "applique" method be used to effectively join a plurality of smaller regions configured as described above to provide a polymer pattern over a large area region, such as the region near and beneath the waterline of a ship.

FIGS. 2(a) and (b) show a substrate 205 coated with a patterned conducting polymeric layer comprising a plurality of discrete and electrically isolated features 215 disposed on a patterned electrode layer 220 in its reduced state 210 and its oxidized state 260, respectively. For simplicity, electrode layer is shown in FIGS. 2(a) and (b) as being unpatterned. Rather, FIG. 3 shows an exemplary interdigitated patterned electrode layer that can properly represent an exemplary patterned electrode layer 220. A gel electrolyte 225 fills the regions between the features 215. A flexible capping layer 240 is shown disposed on the features 215 and gel 225. For example, the capping layer can comprise a flexible polymer, such as a polymer selected from silicones, polyurethanes, or polyimides. In its neutral state shown in FIG. 2(a), the surface of the structure shown has a flat surface topography. To provide the oxidized state 260 shown in FIG. 2(b), a sufficiently high (+) potential to oxidize the polymer (but low enough to avoid breakdown of the polymer) is applied to those electrodes in electrode layer 220 in electrically contact with features 215 with respect to a lower potential (−) which is applied to those electrodes of electrode array 220 in electrical contact with electrolyte 225.

When the patterned polymeric features 215 deform, the gel 225 is moved thus forcing the flexible capping layer 240 to deform. For example, if the patterned polymer features 215 expands longitudinally, such as following oxidation of the polymer, the gel 225 will be pushed upward thus swelling the flexible capping layer 240 in discrete regions over the gap regions (where no features 215 are provided) in the patterned polymer layer.

The purpose of electrolyte gels, such as gel 225, is to provide an ionically conductive medium for ion transport during redox cycling of the device. This can be accomplished by either viscous electrolyte solutions or by a solid gel (cross linked) electrolyte system. Viscous electrolyte solutions can be prepared from standard aqueous or organic electrolyte solutions. Both of these electrolyte solutions are comprised of a mixture of salts and appropriate solvents. Aqueous solutions can be made from water soluble salts, typically sodium or lithium based, such as sodium chloride, sodium or lithium perchlorate, sodium dodecylbenzene sulfonic acid, and sodium p-toluenesulfonic acid. These solutions can be thickened to produce viscous solutions utilizing a number of water soluble polymer materials such as poly (vinyl pyrrolidone), carboxymethyl cellulose. Organic electrolyte solutions employ more organic soluble salts such as t-butyl ammonium based salts of $PF_6$-(hexafluorophosphate), $PF_4$-, and $ClO_4$- in organic solvents such as propylene carbonate and acrylonitrile. These solutions can be thickened to produce viscous liquids utilizing a number of organic soluble polymer materials such as poly(methyl methacrylate) and polycarbonate.

In one embodiment, the patterned electrode layer 220 defines the conducting polymer film features 215, such as available from use of an electrochemical deposition process for the conductive polymer. For example, the electrically conducting polymer films can be electrochemically deposited directly on patterned surface electrodes.

During electrochemical redox cycling the conducting polymer layer comprising features 215 will undergo dynamic changes in contact angle/surface energy/surface tension and preferably, but not necessarily, also changes in topography. The discrete and electrically isolated nature of features 215 permits independent control of the bias applied to respective features 215. This in turn will produce a micropatterned surface with controlled surface energy as a function of feature position and preferably also topography. When topographical changes are provided, by controlling the conducting polymer pattern as well as the electrical stimuli (e.g. potential, wave form, frequency) applied to the conducting polymer 215, various surface patterns can be produced.

In one embodiment, the electrode layer 220 is in the form of an interdigititated pattern. An exemplary interdigitated pattern 300 comprising first electrode array 310 and second electrode array 320 is shown in FIG. 3 along with a power supply 350 to provide bias. In one embodiment, features such as the discrete features 215 shown in FIGS. 2(a) and (b) are disposed over first array 310 while second array 320 contacts an electrolyte, such as electrolyte 225. The electrode pattern can include a plurality of micro or nanoscale features.

Coatings according to the invention can be used in a non-toxic and energy efficient biofouling preventative system. Surface energy has been shown to be a major factor in the adhesion of biofilms. Therefore, by utilizing changes in polymer charge during electrochemical redox cycling of electrically conducting polymer films according to the invention it is possible to dynamically change the surface energy of the resultant polymer surface or a surface disposed thereon and prevent, or at least substantially reduce, biofouling. Thus, biofouling prevention is provided by the coating by dynamically changing the surface energy along with optional dynamic topographical changes in the coating.

A non-toxic biofouling preventative system can include a coating for application to the subsurface of a boat or ship, such as using a plurality of sections including a polymer composite using the technique of applique. The polymeric layer includes at least one electrically conducting polymer and can be a continuous and essentially uniform coating.

An optional electrode layer, such as the interdigitated pattern shown in FIG. 3 comprising first array 310 and second array 320 can underlie the coating. Although not required, the polymer layer can also include a pattern. The pattern can be comprised of a plurality of discrete and electrically isolated features, whereby the respective polymer features are electrically coupled to a plurality of interconnected electrically conductive traces, such as those comprising first array 310.

In an alternate embodiment, the hull of a ship provides one macroscopic electrode layer, with one or more counter electrodes disposed in the water, but spaced apart from the ship. However, in this embodiment the hull would generally need to be isolated in the region proximate to the air/water interface to avoid rusting the hull, such as when a steel hull is involved.

A power supply for supplying electrical bias is connected across the respective electrode layers or electrodes, wherein the electrical bias dynamically changes the surface energy of the polymer layer and preferable also dynamically substantially expands or contracts the polymeric layer. The dynamics of the surface prevents, or at least retards the growth of organisms on the coating. Biofouling is known to occur almost exclusively while a ship is in port. Advantageously, the power supply can supply bias to the coating only when the boat or ship is docked, such as power derived from an on-board nuclear reactor or other power source, whether on-board or remote.

The electrical bias preferable comprises a low voltage and dynamic signal. For example, the voltage range is typically in the less than 2V range, the bias used depending on the particular polymer. PPy is preferably biased from −0.8V to +0.6V, poly(3-methyl thiophene) from +0.2V to +0.8V, polyparaphenylene from −2V to +1.1V, and polyanaline from +0.1V to +0.7V. By changing the substituent(s) on polythiophenes the oxidation/reductions potentials can be moved over to the +1.5V to −1.5V range if desired.

The frequency of the dynamic signal is preferably from 0.01 to 1 hertz, but can be higher or lower than this value. The signal can be a sinusoid, square wave, saw-tooth, or another time varying signal.

Figure 4A:
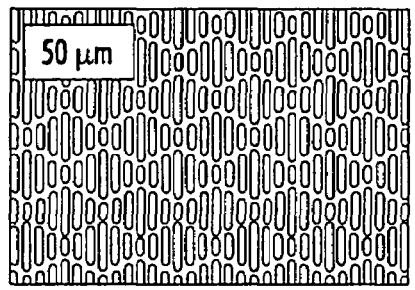
FIGS. 4(a)–(d) illustrate some exemplary polymeric patterns.
Figure 4B:
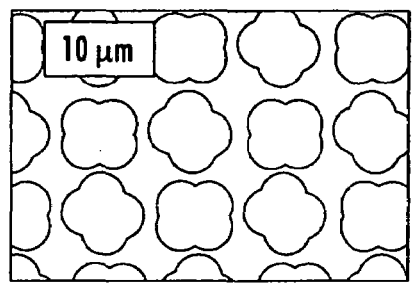
Figure 4C:
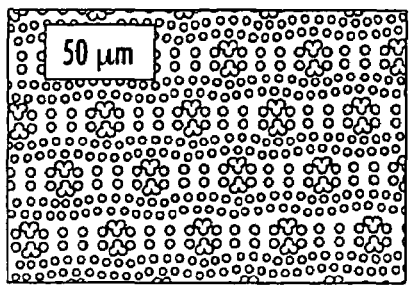
Figure 4D:
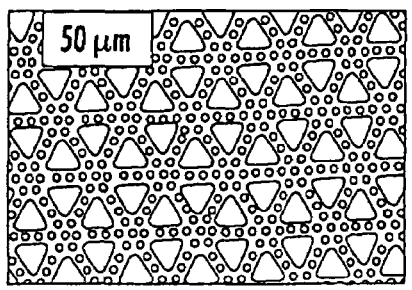

FIGS. 4(a)–(d) illustrate some exemplary polymeric patterns that can be used with the invention. FIG. 4(a) shows a riblet pattern fabricated from PDMSe having features spaced 2 μm apart on a silicon wafer. The features were formed using conventional photolithographic processing. FIG. 4(b) shows a star/clover pattern, FIG. 4(c) a gradient pattern, while FIG. 4(d) shows a triangle/circle pattern.

FIG. 5 provides a table of exemplary feature depths, feature spacings, feature widths and the resulting roughness factor (R) based on the patterns shown in FIGS. 4(a)–(d). Regarding the riblet pattern shown in FIG. 4(a) for the depth, spacing and widths shown, the resulting pattern roughness factor (R) ranged from 5.0 to 8.9. Similar data for the star/clover pattern (FIG. 4(b)), gradient pattern (FIG. 4(c)), and triangle/circle (FIG. 4(d)) are also shown in FIG. 5. Regarding the triangle/circle arrangement (FIG. 4(d)), for a feature depth of 10 μm, feature spacing of 1 μm, and feature width of 1 μm (circles) and 5 μm (triangles), a roughness factor (R) of 13.9 is obtained.

The roughness factor (R) is a measure of surface roughness. R is defined as the ratio of actual surface area (Ract) to the geometric surface area (Rgeo); R=Ract/Rgeo). An example is provided below for a 1 cm$^2$ piece of material. If the sample is completely flat, the actual surface area and geometric surface area would both be 1 cm$^2$. However if the flat surface was roughened by patterning, such as using photolithography and selective etching, the resulting actual surface area becomes much greater that the original geometric surface area due to the additional surface area provided by the sidewalls of the features generated. For example, if by roughening the exposed surface area becomes twice the surface area of the original flat surface, the R value would thus be 2.

The pattern preferably provide a roughness factor (R) of at least 2. It is believed that the effectiveness of a patterned coating according to the invention will improve with increasing pattern roughness (R) above a R value of about 2, and then likely level off upon reaching some higher value of R. Based on preliminary results obtained, it appears that coatings having a sufficient R value can in some cases be effective as biofouling preventive agents (see Examples) without the need for the dynamic surface effects provided by the electroactive polymer or polymer composite. However, the combination of feature topography which provides an R value of at least 2 with the dynamic surface characteristics provided by electroactive polymers and related composites according to the invention are expected to provide synergistic biofouling preventive effects.

In a preferred embodiment, the roughness factor (R) is at least 4, such as 5, 6, 7, 8, 9, 10 11, 12, 13,14, 15, 16, 17, 18, 19, 20, 25 or 30. Assuming deeper and more closely spaced features can be provided, R values can be higher than 30.

Feature spacing can also be an important design parameter. If the feature spacing is smaller than the size of the organism, it has been found that the growth of the organism is generally retarded. For example, an algae spore is generally 2 to 5 μm in size. Accordingly, to retard adhesion of algae spores, a feature spacing of less than 2 μm is preferably used to retard algae spore growth.

The dynamic surface effects provided coatings according to the invention can also be used to form low voltage electrowetting-based devices, including microfluidic pumps. Current mechanical micropumping devices generally employ several types of piezoelectric, thermal, shape memory alloy, and electrostatic actuation mechanisms. Direct micropumping systems utilize principles such as magnetohydrodynamics, electrophoresis, and thermally induced surface tension as actuators.

Electrowetting is the process of changing the surface wettability (surface tension) of a metal electrode by rearrangement and or formation of an electronic double layer (EDL) at the surface of the electrode due to an applied electrical potential. The electrowetting (EW) process has been extensively studied for pure metal electrodes with electrolyte solutions. EW devices have been limited to uses in polar media due to the nature of the formed EDL. The EDL is formed from the transfer of electrons from the electrode to redox-active species in the fluid medium. The electrical stability of the EDL limits the use of these devices to low voltages, as low as about 1V. However the induced change in contact angle (Δθ) is proportional to the amount of charge developed at the electrode surface thereby limiting the overall Δθ that can be produced. Two major applications for this technology are in micro-fluidic devices and MEMS type applications.

Recent studies have found that the application of a thin dielectric layer (e.g. PTFE or $SiO_2$) between the electrode and the fluid can enhance this effect and allow the pumping/wetting of virtually any fluid medium. This arrangement is referred to as electrowetting-on-dielectric (EWOD).

In EWOD, the surface property of a dielectric film can be modified between hydrophobic and hydrophilic states using an electric field. However, a higher electrical potential is required to drive these systems as compared to conventional electrowetting. Typical operating voltages for EWOD devices generally exceed 100–200V.

Figure 6:
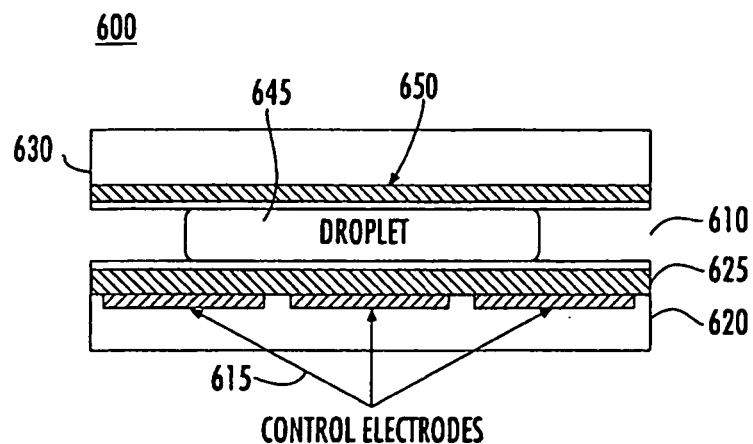
FIG. 6 shows an electrowetting pump, according to yet another embodiment of the invention.

The EWOD process can cause a droplet of liquid to bead or spread out on the surface depending upon its surface state. As shown in FIG. 6, electrowetting-based fluid pump 600 includes a fluid conduit 610 which includes a bottom plate 620 including a plurality of control electrodes 615 disposed thereon. Top plate 630 includes ground electrode 650. A polymeric layer 625 comprising an electrically conducting polymer is disposed on the control electrodes 615. Although shown as a continuous and uniform layer, polymeric layer 625 can be a patterned layer. Droplet 645 is disposed in fluid conduit 610 and generally includes a suitable electrolyte.

During normal operation of pump 600, a power supply (not shown) applies an alternating bias potential across droplet 645 through application of an electrical signal between ground electrode 650 and the control electrodes 615. The bias dynamically alternates a surface tension of polymeric layer with respect to droplet 645 between a high to a low level. The alternating surface tension pumps the droplet 645 and as a result a fluid comprising droplets 645 through the fluid conduit 610. Pumping using pump 600 according to the invention can be achieved with as little as 5 volts, such as 2 volts.

The pump 600 can be formed using MEMS technology using conventional substrate materials, such as silicon. Thus, the top 630 and bottom plate 620 can be formed from silicon dioxide or other layers which are readily grown or deposited in silicon-based integrated circuit processing. Use of MEMS facilitates the low cost fabrication of micro-scale or nanoscale features, as well as electronic components proximate to the pump 600, such as an oscillator for the bias to pump 600 and control electronics if desired.

Various methods can be used to blend a non-electrically conductive polymer with an electrically conductive polymer in applications when for the invention when a polymer composite is desired. Modification of bulk materials can be accomplished by the development of interpenetrating polymer networks (IPN's) and polymer blends. Surface modification can also be accomplished by the formation of surface grafts and/or IPN's. IPN formation can be carried out chemically and electrochemically using known methods in aqueous and organic solutions. Vapor phase chemical polymerization can also be used.

Supercritical $CO_2$ (sc$CO_2$) has also been determined to be an effective method for incorporation electrically conducting polymers into various non-electrically conducting materials. Sc$CO_2$ offers improved sample preparation speed and a significant reduction in required solvent to impregnate the samples. Supercritical $CO_2$ has been found to be an improved method of impregnating PDMSe with the required oxidizers to form conducting polymer/PDMS blends. This process greatly reduces the time and cost (lower solvent requirements) required to process these materials. When the pressure and temperature of carbon dioxide ($CO_2$) is raised above 31° C. and 7.38 MPa the $CO_2$ enters the super critical state (sc$CO2$). In this state $CO_2$ has the properties of both a gas and a liquid, giving it the ability to carry solutes and easily penetrate/swell polymeric materials. The solubility of the sc$CO_2$ can be controlled by varying the temperature and pressure above the supercritical point and by the incorporation of cosolvents such as methanol, and ethanol, into the reaction chamber.

In the sc$CO_2$ process samples (and cosolvents such as methanol and ethanol, if needed) and dopants (oxidizers) are placed in a high pressure chamber which is subsequently filled with liquid carbon dioxide (Li$CO_2$). The chamber temperature and pressure is then raised above 31° C. and 7.38 MPa putting the Li$CO_2$ in the super critical state. The samples are left in the sc$CO_2$ for the desired reaction time. Once the desired soaking time has been reached the chamber temperature and pressure is slowly lowered until it has returned to room temperature and pressure.

Alternatively, a swelling technique can be used to form the polymer composite. For example, a thermoplastic elastomer can be prepared by compression molding to desired thickness and then cut to the desired shape. The thermoplastic elastomer samples can then be doped with $FeCl_3$ by soaking in a $FeCl_3$/THF solution. After soaking, the samples can be removed from the solution and the residual THF removed under vacuum for about 1 Hr. After drying the samples can be soaked in the vapor of a monomer of an electrically conductive polymer to form the desired composite. The sample can then again be dried under vacuum to remove any residual monomer.

Alternatively, electrically conducting polymer composites can be formed using a solution casting technique. The swelling technique described above involves swelling the preformed sample in an solvent/oxidizer solution (THF/$FeCl_3$) and then exposing the doped sample to pyrrole monomer vapor. The solution casting technique is similar to the swelling technique described above except that instead of swelling the material the polymer is predissolved in a solvent solution (e.g. THF/FeCl3) and then the sample is casted from solution. This allows the samples to be spin cast, sprayed (e.g. spray paint), or painted on. This method has been demonstrated using a polysulfone (Udel P-1700 NT11 polysulfone (Solvay Advanced Polymers, Alpharetta, Ga.), but other polymers can be formed using this technique including polycarbonates, polymethylmethacrylates, and similar materials. This process provides more diversity in the base/matrix materials which can be used and application techniques which can be used. An exemplary solution casting technique is described below:

i) dissolve ~5 wt/vol % polysulfone and ~1 wt/vol % $FeCl_3$ in THF;

ii) apply the solution to substrate (spin cast, or spray) and allow to dry;

iii) expose the sample to pyrrole monomer vapor for predetermined time; and iv) remove residual pyrrole monomer vapor under vacuum.

EXAMPLES

It should be understood that the example and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Polypyrrole (PPy) Surface Modified PDMSe

Surface modified PDMSe samples were prepared by soaking four PDMSe films in a 0.1 M Fe(III)$Cl_3$ (oxidizer), $NaClO_4$ (dopant) solution in ethanol for about 70 hrs. Ethanol is a good solvent for inorganic salts but is a poor solvent for silicone. This results in incorporation of the oxidant and dopant into only the surface layer of the PDMSe samples. PDMSe films were removed from the solutions and allowed to dry (evaporation of ethanol). The samples were then rinsed with distilled water (DI $H_2O$) to remove any inorganic salts laying directly on the surface. The PDMSe samples were then exposed to pyrrole vapor about 48 hrs to facilitate polymerization. PPy modified PDMS films were then allowed to dry (evaporate residual monomer on surface) and were subsequently rinsed with ethanol and DI $H_2O$ to remove any surface coating of PPy and any residual pyrrole monomer.

Figure 7:
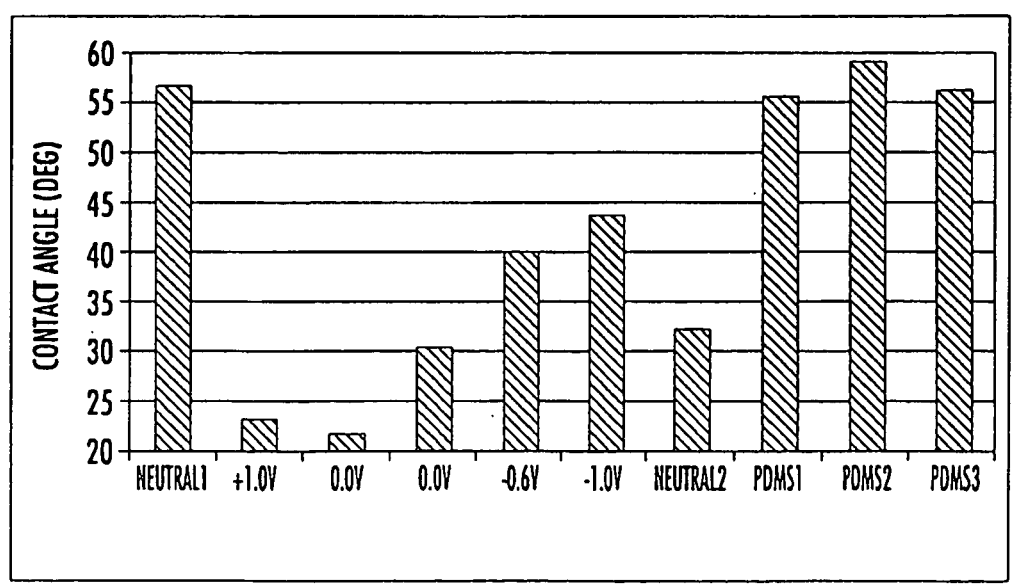
FIG. 7 provides contact angle data obtained from polypyrrole/polydimethyl siloxane (PPy/PDMSe) samples, using a captive bubble technique in distilled $H_2O$.
Figure 8:
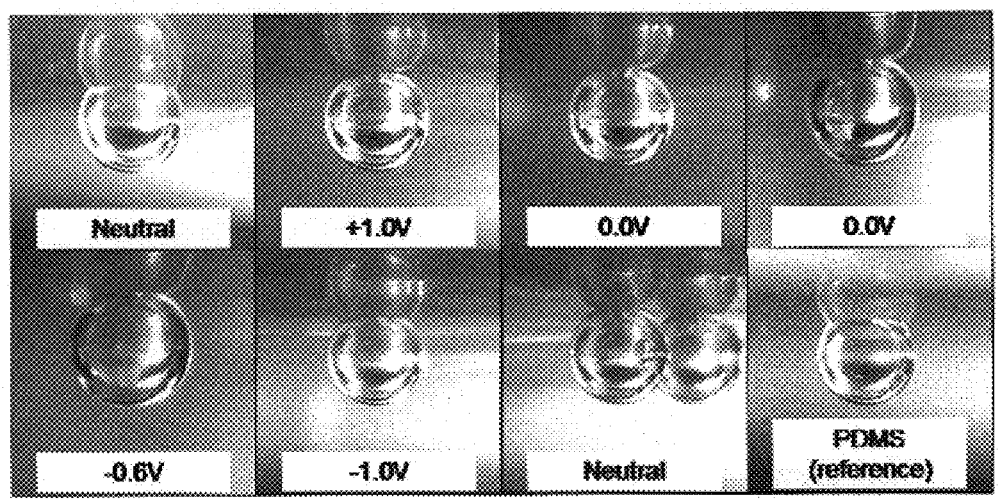
FIG. 8 are images of PPy/PDMSe samples using the captive bubble technique.

Contact angle measurements were then taken in DI $H_2O$ by captive bubble technique. A 2 μL bubble was placed on the PPy/PDMSe sample and contact angles were measured on both the left and right sides of the bubble and then averaged. FIG. 7 shows contact angle values for PPy/PDMSe samples using a captive bubble technique in distilled $H_2O$, while FIG. 8 shows images of the same.

The initial contact angle for the neutral surface (not connected to potentiostat) was 57 deg, which is similar to that obtained from pure PDMSe. When a voltage of +1.0V was applied (oxidized PPy, positive surface charge) the contact angle dropped to 23 deg. The contact angle was then raised to 44 deg when −1.0V was applied (reduced PPy, nearly neutral surface charge).

When the PPy/PDMSe sample was returned to a neutral state (disconnected from the potentiostat and allowed to sit for 10 min.) the contact angle remained diminished to 32 deg compared to the original contact angle. This was subsequently checked about 24 hrs later with little change. This could be due to a permanent rearrangement of the surface after the charge was applied, resulting in PPy to remain on the surface. PPy is very stable in its oxidized state and exists predominantly in this state unless driven chemically or electrochemically into its reduced state resulting in residual surface charge even when not under direct stimuli.

Polypyrrole (PPy) Surface Modified Polypropylene

In another experiment, EPDM rubber particles dispersed in polypropylene matrix (SANTOPRENE®, Advanced Elastomer Systems, Akron, Ohio) were prepared by compression molding to a desired thickness and then cut to the desired shape. The SANTOPRENE® samples were then doped with $FeCl_3$ by soaking in a 5 wt/vol % $FeCl_3$/THF solution for 24 Hrs. After soaking, the samples are removed from the solution and the residual THF was removed under vacuum for about 1 Hr. After drying, the samples were soaked in pyrrole monomer vapor for 24 Hrs to form polypyrrole/SANTOPRENE® IPN samples. Samples were then again dried for about 1 Hr under vacuum to removed residual pyrrole monomer.

Figure 9:
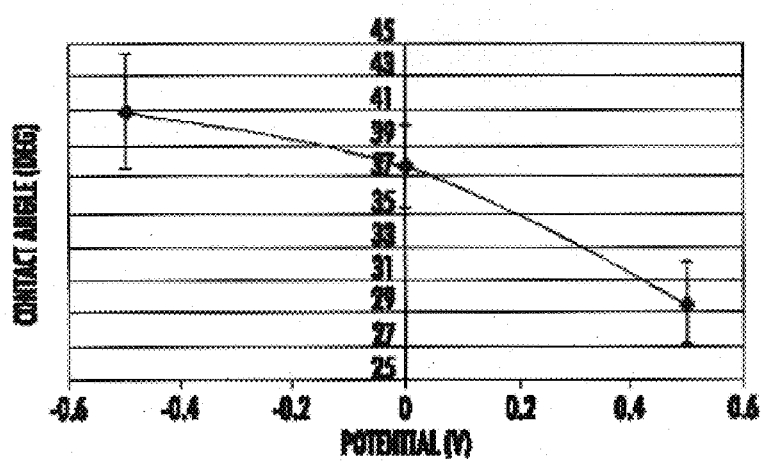
FIG. 9 is a graphical representation of contact angle data obtained using polymer composites according to the invention demonstrating a 12 degree contact angle change between the reduced and oxidized state of the polymer.

Table 1 below compiles contact angle values obtained from the polypyrrole/SANTOPRENE® IPN samples formed as described above in artificial sea water using applied fixed potentials of +0.5V, 0.0V, and −0.5V. Samples were placed in artificial sea water and then cycled from +/−1.0V at 10 mv/sec for 10 cycles to condition films prior to testing. Contact angle was measured using the captive air bubble technique and angles were measured using UTH-SCSA Imagetool software. FIG. 9 is a graphical representation of the contact angle data shown in Table 1 below.

|  | 0.0 V | +0.5 V | −0.5 V |
|---|---|---|---|
|  | 38 | 31 | 44 |
|  | 35 | 33 | 45 |
|  | 38 | 27 | 39 |
|  | 36 | 29 | 43 |
|  | 42 | 29 | 37 |
|  | 37 | 28 | 38 |
| avg | 38 | 30 | 41 |
| stdev | 2.4 | 2.2 | 3.4 |

The contact angle is seen to change about 12 degrees between the reduced and oxidized state of the polymer layer.

Figure 10:
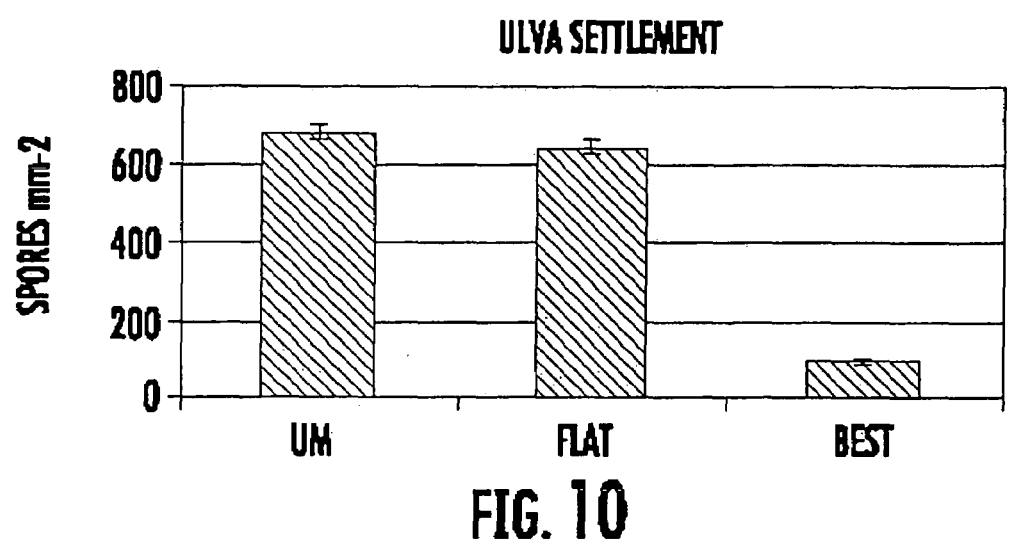
FIG. 10 is a table showing comparative Ulva spore (green algae) settlement data. An 86% reduction in Ulva settlement is demonstrated using a preferred patterned surface (BEST) compared to control samples.

As noted above, use of polymer patterns having topography including sufficiently high surface roughness (R) may be sufficient by itself to retard the growth of certain organisms. FIG. 10 is a data table including settlement data obtained for green algae (Ulva zoospores; diameter about 5 μm) comparing the control samples "UM" and "Flat" to a biomimetic pattern (referred to as "BEST"). All samples used PDMSe.

The UM sample was a flat PDMSe sample cast against a glass slide as a control sample. The Flat sample was a flat area sample on a patterned PDMSe slide (cast against patterned silicon wafers). The patterned wafers for the Flat samples had unpatterned areas around and in between some of the patterned areas. The BEST biomimetic pattern mimics nature and was comprised of diamond packed ribs 2 μm wide, 2 μm space, and 4–16 μm in length. This close packed pattern had dimensions on the order of the Ulva zoospores.

The spore concentration on the BEST sample was found to be about 86% less than settlement on either the UM of Flat controls. It is believed that the BEST samples were more effective than the controls because the pattern dimensions were a little smaller than the spore size which prevented the spores from fitting into the gap regions of the BEST pattern.

In related experiments a plasma treatment was used. Radio frequency glow discharge (RFGD) plasma treatment is a common procedure to give many materials various surface attributes. Many biomaterials are plasma treated to enhance the biological response associated with an increase in surface wettability. The plasma process involves the ionization of a gas (Ar) present in a chamber due to the presence of a radio frequency current. PDMSE coated slides were placed about 3.5 inches below the RF coil. The RF power, operating at 13.56 MHz, was then turned on and slides were treated at 50 Watts and 50 mTorr. Times for plasma treatment were 1 minute and 15 minutes, while control slides were untreated.

For PDMSe, the functional groups present on the surface of the elastomer can be cleaved by the plasma to form free radicals, which then form hydroxyl groups when exposed to air. This makes the surface very hydrophilic and gives sessile drop water contact angles of less than 10 degrees. Accordingly, diffusion of low molecular weight species to the surface, condensation of surface hydroxyl groups, and migration of in situ created low molecular weight species during discharge to the surface can occur. Thus, plasma treatment can cause reorientation of polar groups from the surface to the bulk or bulk to the surface. Plasma treatment can also cause a progressive oxidation of the surface that changes the surface into a silica-like state. A significant decrease in roughness with increasing time of exposure to the plasma generally also results.

As noted above, the combination of feature topography which provides an R value of at least 2 with the dynamic surface characteristics provided by electroactive polymers and related composites according to the invention are expected to provide synergistic biofouling preventive effects. Plasma treatment will likely provide an additional synergy with either or both feature topography which provides an R value of at least 2 and dynamic surface characteristics provided by electroactive polymers according to the invention.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A dynamic polymer-based coating, comprising:
   at least one patterned polymeric layer including a plurality of discrete features electrically isolated from one another for attachment to a surface, said polymeric layer including at least one electrochemically oxidizable and reducible and electrically conductive polymer (EORECP), said EORECP having at least a partially conjugated polymer backbone and providing a room temperature electrical conductivity of between 0.1 S/cm and 1,000 S/cm, and
   an electrode layer in electrical contact with said EORECP.

2. The coating of claim 1, wherein said polymeric layer substantially expands or contracts in at least one direction upon at least one of oxidation and reduction.

3. The coating of claim 1, wherein said plurality of features comprise microscale or nanoscale features.

4. The coating of claim 3, wherein said plurality of features provide a roughness factor (R) of at least 2, R being defined as the ratio of actual surface area (Ract) to the geometric surface area (Rgeo); R=Ract/Rgeo.

5. The coating of claim 4, wherein said roughness factor is at least 8.

6. The coating of claim 4, wherein a spacing between adjacent ones of at least a portion of said plurality of features is less than 2 μm.

7. The coating of claim 1, wherein said polymeric layer is a polymer composite, said composite including at least one non-electrically conducting polymer mixed with said EORECP.

8. The coating of claim 7, wherein said non-electrically conducting polymer comprises at least one selected from the group consisting of elastomers, rubbers, polyurethanes, polyimides, polyamides and polysulfones.

9. The coating of claim 1, wherein said EORECP comprises at least one selected from the group consisting of polypyrrole, poly(p-phenylene) and polythiophene, and derivatives thereof.

10. The coating of claim 1, wherein said electrode layer comprises a metal.

11. The coating of claim 10, wherein said electrode layer is patterned, said pattern comprising a plurality of microscale or nanoscale features.

12. The coating of claim 11, wherein said pattern is interdigitated.

13. The coating of claim 1, further comprising a capping layer disposed on said patterned polymeric layer.

14. The coating of claim 13, wherein said capping layer comprises a flexible polymer, said flexible polymer selected from the group consisting of silicones, polyurethanes, and polyimides.

15. The coating of claim 13, further comprising a solid polymer electrolyte disposed between said plurality of features of said patterned polymeric layer.

16. A non-toxic biofouling preventative system, comprising:
   a polymer-based coating disposed on a solid surface, said coating comprising a polymeric layer, said polymeric layer including at least one electrochemically oxidizable and reducible and electrically conductive polymer (EORECP), said EORECP having at least a partially conjugated polymer backbone and providing a room temperature electrical conductivity of between 0.1 S/cm and 1,000 S/cm,
   an electrochemically active counter electrode spaced apart from said coating;
   an aqueous solution including an electrolyte in contact with said coating and said counter electrode, and
   a power supply for supplying a dynamic electrical signal to said polymeric layer, relative said counter electrode sufficient for oxidization or reduction of said EORECP.

17. The system of claim 16, wherein said polymeric layer substantially expands or contracts in at least one dimension upon at least one of said oxidation and reduction.

18. The system of claim 16, wherein said solid surface comprises a metal, wherein one terminal of said power supply is electrically connected to said solid surface.

19. The system of claim 16, wherein said polymeric layer is a patterned polymer layer including a plurality of discrete features electrically isolated from one another.

20. The system of claim 19, where said patterned polymeric layer comprises a plurality of microscale or nanoscale features.

21. The system of claim 20, wherein said plurality of features provide a roughness factor (R) of at least 2, R being defined as the ratio of actual surface area (Ract) to the geometric surface area (Rgeo); R=Ract/Rgeo.

22. The system of claim 21, wherein said roughness factor is at least 8.

23. The system of claim 21, wherein a spacing between adjacent ones of said plurality of features is less than 2 μm.

24. The system of claim 16, wherein said polymeric layer includes at least one non-electrically conductive polymer mixed with said electrically conducting polymer.

25. The system of claim 19, further comprising a patterned electrode layer in electrical contact with said polymeric layer, wherein said electrode pattern is interdigitated.

26. The system of claim 16, wherein said solid surface comprises a subsurface of a boat or ship.

27. The system of claim 16, wherein said solid surface comprises a metal or metal alloy, said metal or metal alloy solid surface providing said counter electrode.

* * * * *